United States Patent [19]

Peterson

[11] Patent Number: 4,577,162

[45] Date of Patent: Mar. 18, 1986

[54] CLOCKED GAIN STAGE HAVING DIFFERENTIAL INPUTS AND OUTPUTS

[75] Inventor: Joe W. Peterson, Austin, Tex.

[73] Assignee: Motorola, Inc., Schaumburg, Ill.

[21] Appl. No.: 728,628

[22] Filed: Apr. 29, 1985

[51] Int. Cl.$^4$ ............................ H03F 3/16; H03F 3/04
[52] U.S. Cl. .................................. 330/253; 330/261; 330/277
[58] Field of Search ................ 330/51, 107, 109, 253, 330/258, 259, 261, 277

[56] References Cited

U.S. PATENT DOCUMENTS 4,502,019  2/1985  Van Roermund ................ 330/51 X

Primary Examiner—Eugene R. LaRoche
Assistant Examiner—Steven J. Mottola
Attorney, Agent, or Firm—Anthony J. Sarli, Jr.; Jeffrey Van Myers; Robert L. King

[57] ABSTRACT

A fully differential gain stage having high gain and common-mode feedback is provided with minimal circuitry. Differential input transistors adapted to receive differential input voltages are coupled to load transistors. During a first time period, the gain stage is placed in unity gain and the load transistors are configured as diodes. Charge storage devices are charged during the first time period with a charge which is proportional to both the current of a current supply and the physical dimensions of the load transistors. During a second time period, the charge storage devices provide a bias voltage to the load transistors which maintains the common-mode output voltage at a predetermined value. During the second time period, the gain stage is configured for high gain operation.

8 Claims, 3 Drawing Figures

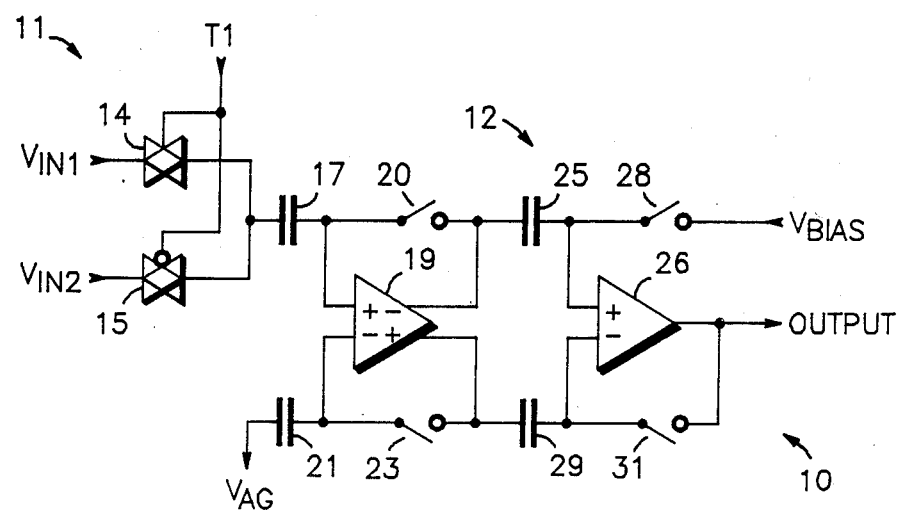
FIG. 1
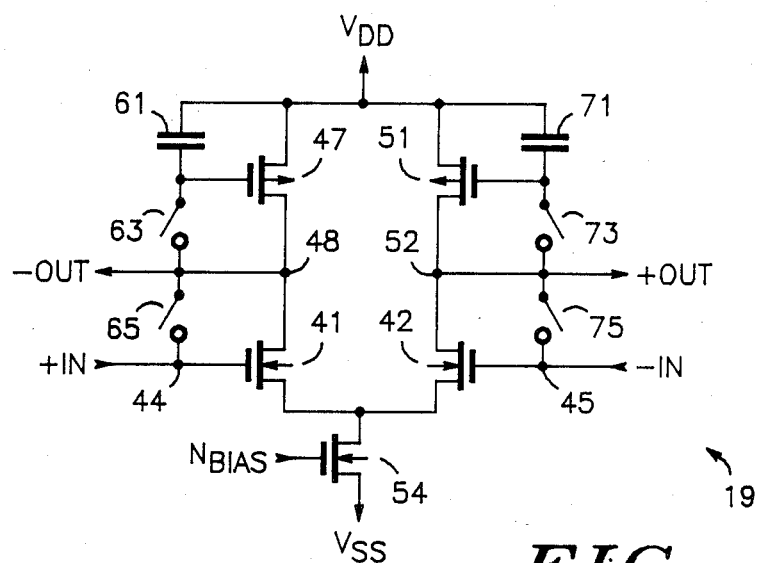
FIG. 2
FIG. 3
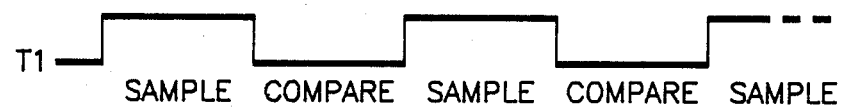

CLOCKED GAIN STAGE HAVING DIFFERENTIAL INPUTS AND OUTPUTS

CROSS REFERENCE TO RELATED APPLICATION

U.S. Application Ser. No. (06/728,628) entitled, "A Fully Differential Operational Amplifier With D.C. Common-Mode Feedback", filed simultaneously herewith by James A. McKenzie and Joe W. Peterson.

TECHNICAL FIELD

This invention relates generally to gain stages, and more particularly, to a gain stage having low common-mode voltage error and high gain.

BACKGROUND ART

Differential amplifiers having differential inputs and differential outputs provide much better power supply rejection than differential amplifiers with single ended outputs and are commonly used in amplifier applications. Poor common-mode power supply rejection associated with single ended output differential amplifiers results from different impedances being coupled to the power supply from each output side of a conventional single ended differential amplifier structure. Poor common-mode power supply rejection substantially limits circuit operation at high frequency. Therefore, fully differential amplifiers are very preferable for applications requiring good power supply rejection. However, fully differential operational amplifiers typically require feedback control circuitry for establishing and regulating the common-mode output voltage. The common-mode output voltage control increases the size of the differential amplifier and common-mode feedback circuitry commonly introduces additional frequency poles into the gain stage which must also be compensated.

BRIEF DESCRIPTION OF THE INVENTION

Accordingly, an object of the present invention is to provide an improved gain stage having differential inputs and outputs.

Another object of the present invention is to provide an improved gain stage having common-mode voltage control and which minimizes circuitry.

Yet another object of the present invention is to provide an improved fully differential gain stage which is clocked and needs no frequency compensation.

In carrying out the above and other objects of the present invention, there is provided, in one form, a gain stage for receiving first and second input voltages and providing first and second output voltages proportional to a differential of the first and second input voltages. A pair of differential input transistors of a first conductivity type for receiving the first and second input voltages. Current supply means coupled to the differential input transistors supply or sink current thru the differential input transistors. A pair of load transistors of a second conductivity type is coupled to the pair of differential input transistors and provide a load to the differential input transistors. Charge storage means are coupled to the load transistors for selectively storing a charge proportional to a predetermined common-mode output voltage of the gain stage. The charge storage means selectively bias the load transistors to maintain the output common-mode voltage during the operation of the gain stage.

These and other objects, features and advantages will be more clearly understood from the following detailed description taken in conjunction with the accompanying drawings.

BRIEF DESCRIPTION OF THE DRAWINGS

FIG. 1 illustrates in block diagram form a comparator utilizing a gain stage with differential inputs and outputs;

FIG. 2 illustrates in schematic form a gain stage in accordance with the present invention; and FIG. 3 illustrates a control signal for use with the circuits illustrated in FIGS. 1 and 2.

DETAILED DESCRIPTION OF THE INVENTION

Shown in FIG. 1 is a comparator 10 having a fully differential gain stage 11 and a differential to single ended output gain stage 12. In gain stage 11, a first input voltage labeled $V_{IN1}$ is coupled to a first terminal of a switch 14 illustrated as a conventional CMOS transmission gate. A second input voltage labeled $V_{IN2}$ is coupled to a first terminal of a switch 15 also illustrated as a conventional CMOS transmission gate. Second terminals of switches 14 and 15 are connected together and connected to a first electrode of a capacitor 17. A clock signal labeled $T_1$ and illustrated in FIG. 3 is connected to a control electrode of a first conductivity type of switch 14 and to a control electrode of a second conductivity type of switch 15. Switches 14 and 15 are each clocked in a conventional manner by signal $T_1$ and a non-overlapping complement of signal $T_1$. A second electrode of capacitor 17 is connected to both a positive or non-inverting input of a differential amplifier 19 and a first terminal of a switch 20. A first electrode of a capacitor 21 is connected to a voltage reference terminal for receiving a reference voltage, say analog ground $V_{AG}$. A second electrode of capacitor 21 is connected to both a negative or inverting input of differential amplifier 19 and to a first terminal of a switch 23. A second terminal of switch 20 is connected to both a negative output of differential amplifier 19 and to a first electrode of a capacitor 25. A second terminal of switch 23 is connected to both a positive output of differential amplifier 19 and to a first electrode of a capacitor 29. A second electrode of capacitor 25 is connected to both a positive input of a differential amplifier 26 and to a first terminal of a switch 28. A second terminal of switch 28 is coupled to a bias voltage labeled $V_{BIAS}$. A second electrode of capacitor 29 is connected to both a negative input of differential amplifier 26 and to a first terminal of a switch 31. A second terminal of switch 31 is connected to an output of differential amplifier 26. In the illustrated form, switches 20, 23, 28 and 31 may each be implemented by a single transistor also controlled by clock signal $T_1$ wherein each switch is conductive in response to a logic high level of $T_1$.

In operation, comparator 10 operates to sample a first input voltage $V_{IN1}$ during a sample phase and then compares the value of $V_{IN1}$ with a second input voltage $V_{IN2}$ during a compare phase. The difference between the two input voltages is provided in amplified form by gain stage 19. The difference voltage is further amplified by differential amplifier 26 and provided as a digital output proportional to the magnitude of the difference between the two input voltages. In particular, during the sample period, switch 14 is conductive and switch 15 nonconductive. Additionally, switches 20, 23, 28 and 31 are made conductive during the sample period by a logic high level. Therefore, in gain stage 19 both output terminals and both input terminals are forced to be substantially equal in voltage potential during the sample period. Simultaneously, capacitor 17 is charged to a voltage potential substantially equal to $V_{IN1}$. Differential amplifier 26 is placed in a unity gain configuration during the sampling with the output forced to a predetermined bias voltage $V_{BIAS}$. Prior to the compare phase, switches 20, 23, 28 and 31 are made nonconductive.

During the compare phase, input voltage $V_{IN2}$ is coupled to gain stage 19. The voltage at the positive input of gain stage 19 becomes equal to the difference between the two input voltages as the voltage across capacitor 17 remains substantially constant in accordance with conservation of charge laws. The voltage differential between $V_{IN1}$ and $V_{IN2}$ is amplified by gain stage 19 having differential outputs which diverge about a predetermined common-mode output voltage proportional to the two sampled input voltages. Differential amplifier 26 further amplifies the compared difference in input voltages and provides a digital output voltage level indicating whether the input voltage $V_{IN2}$ is greater or less than input voltage $V_{IN1}$.

In the illustrated form, comparator 11 provides good common-mode power supply rejection since gain stage 19 is fully differential. Further, the symmetric structure of comparator 11 inherently minimizes offset voltages of gain stage 11 and differential amplifier 26 caused by parasitic capacitance and other error voltages associated with switches 20, 23, 28 and 31. Because of the symmetry, substantially equal error voltages are coupled to both inputs of gain stage 19 and differential amplifier 26 which balances out the error voltage. Noise coupling errors and switch coupling errors are therefore substantially eliminated.

Shown in FIG. 2 is a schematic implementation of gain stage 19 of FIG. 1 in accordance with the present invention. Although specific N-channel and P-channel MOS devices are shown, it should be clear that gain stage 19 could be implemented by completely reversing the processing techniques (e.g. P-channel to N-channel) or by using other types of transistors. A differential pair of N-channel input transistors 41 and 42 are provided with each transistor having a gate for respectively receiving a positive and a negative input voltage, at nodes 44 and 45 respectively. A drain of transistor 41 is connected to a drain of a P-channel load transistor 47 at an output node 48 for providing a negative output voltage. A source of transistor 47 is connected to a first power supply terminal for receiving a supply voltage, say $V_{DD}$. A drain of transistor 42 is connected to a drain of a P-channel load transistor 51 at an output node 52 for providing a positive output voltage. A source of transistor 51 is connected to the first power supply terminal. Transistors 41 and 42 have the sources thereof connected together and to a drain of an N-channel transistor 54. A gate of transistor 54 is coupled to a bias voltage, labeled $N_{BIAS}$, and a source of transistor 54 is connected to a second power supply terminal for receiving a supply voltage, say $V_{SS}$. For purposes of illustration, supply voltage $V_{DD}$ will be assumed to be more positive than supply voltage $V_{SS}$. A first electrode of a capacitor 61 is connected to the first power supply voltage terminal, and a second electrode of capacitor 61 is connected to both a gate of transistor 47 and a first terminal of a switch 63. A second terminal of switch 63 is connected to output node 48 and to a first terminal of a switch 65. Switches 63 and 65 are controlled by control signal $T_1$ of FIG. 3 and are conductive in response to a logic high level. It should be readily apparent that switch 65 is analogous to switch 20 illustrated in FIG. 1. A second terminal of switch 65 is connected to the gate of transistor 41 at node 44. A first electrode of a capacitor 71 is connected to the first power supply terminal, and a second electrode of capacitor 71 is connected to both a gate of transistor 51 and a first terminal of a switch 73. A second terminal of switch 73 is connected to both output node 52 and a first terminal of a switch 75. Switches 73 and 75 are controlled by control signal $T_1$ of FIG. 3 and are conductive in response to a logic high level. It should be readily apparent that switch 75 is analogous to switch 23 of FIG. 1. A second terminal of switch 75 is connected to the gate of transistor 42 at node 45. Switches 63, 65, 73 and 75 may be implemented by any of several conventional transistor switches.

In operation, gain stage 19 is capable of both controlling the common-mode output voltage and providing high gain without using a large amount of circuitry. During a sample phase, switches 63, 65, 73 and 75 are conductive. Transistors 47 and 41 form one leg or side of the differential structure and transistors 51 and 42 form a second leg or side of the differential structure. In the sample phase, switches 63 and 73 connect or short the gate and drain of transistors 47 and 51, respectively, so that transistors 47 and 51 are each effectively configured as diodes. When transistors 47 and 51 are diode-connected, the impedance of each of nodes 48 and 52 is lowered to the reciprocal of the transconductance ($g_m$) of each of transistors 47 and 51, respectively. In other words, switches 63 and 73 function to selectively vary the impedance at output nodes 48 and 52 by varying the structural configuration of transistors 47 and 51, respectively. During the sample phase when switches 63, 65 and switches 73, 75 are conductive, transistors 47 and 51 are used to establish a bias voltage which is charged onto capacitors 61 and 71, respectively. The D.C. bias voltage charged onto each of capacitors 61 and 71 is substantially equal to the common-mode output voltage. In the sample phase, the voltage at each of nodes 48 and 52 is substantially equal so that the gate-to-source voltages of transistors 47 and 51 are substantially equal and the gate-to-source voltages of transistors 41 and 42 are substantially equal. Therefore, the common-mode output voltage is determined by the amount of bias current thru transistor 54 and the physical dimensions of transistors 47 and 51. Transistor 54 which is biased by an N-channel bias voltage functions as a current supply to source or sink current depending upon the conductivity type of the transistors used to implement the invention. Assuming the threshold voltages of transistors 47 and 51 are equal, the common-mode output voltage is approximately equal to supply voltage $V_{DD}$ minus the threshold voltage of transistor 47. Because nodes 48 and 52 are low impedance nodes during the sample phase, no compensation capacitors are needed for stability and the common-mode output voltage is quickly charged onto capacitors 61 and 71.

During an operation phase such as a compare phase, switches 63, 65, 73 and 75 are nonconductive. The gate-to-source voltage of transistors 47 and 51 is maintained at substantially the same value established during the sample phase by the bias voltage stored by capacitors 61 and 71, respectively. The gate bias voltage of each of transistors 47 and 51 is fixed, and transistors 47 and 51 function as current sources with a very high impedance equivalent to the small signal drain-to-source impedance ($r_{DS}$) since neither transistor is connected as a diode. Therefore, a very high voltage gain is provided by gain stage 19 during the operation phase.

In the illustrated form, gain stage 19 provides common-mode voltage control and high gain without using a large amount of circuitry. The present invention differs from prior art approaches which commonly implement gain stages by using circuitry to accurately set the bias voltage necessary to maintain a predetermined common-mode output voltage. In contrast, the present invention uses two time periods in which during a first time period both sides or legs of a differential structure have the same low impedance as seen from the differential outputs, and a bias voltage is established for setting the common-mode output voltage. Then during a second time period, the impedance as seen from the differential outputs becomes very high resulting in large voltage gains. However, the common-mode bias voltage does not substantially vary because the bias voltage established during the first time period remains coupled to the control electrode of the load transistor of each side of the differential structure. Further, only a single clock signal is required. The present invention has good power supply rejection associated with the fully differential structure and also provides excellent cancellation of switch charge feedthru by coupling equal charges to both the positive and negative inputs where the charges are summed to zero.

While an embodiment has been described using certain assumed parameters and transistor types, it should be understood that certain obvious modifications to the circuit or the given parameters will become apparent to those skilled in the art, and the scope of the invention should be limited only by the scope of the claims appended hereto.

I claim:

1. A gain stage for receiving first and second input voltages and providing first and second output voltages proportional to a differential of the first and second input voltages, comprising:

a pair of differential input transistors of a first conductivity type for receiving the first and second input voltages;

current supply means coupled to the differential input transistors, for providing current to the differential input transistors;

a pair of load transistors of a second conductivity type, each load transistor coupled to a respective one of the differential input transistors, for provding a load to the differential input transistors; and charge storage means coupled to the load transistors for selectively storing a charge proportional to a predetermined output voltage of the gain stage and selectively using the stored charge to bias said load transistors.

2. The gain stage of claim 1 wherein the charge storage means comprise first and second capacitors, each of said first and second capacitors being connected between a control electrode and a current electrode of a predetermined one of the load transistors.

3. The gain stage of claim 1 further comprising: switching means for selectively coupling the gain stage in a unity gain configuration and coupling each of the differential input transistors in a diode configuration while coupling the first and second capacitors to the first and second output voltages, respectively.

4. In a gain stage having a pair of differential input transistors for receiving first and second input voltages, current supply means coupled to the differential input transistors for providing current to the differential input transistors, and first and second load transistors coupled to respective ones of said differential input transistors for developing first and second output voltages at first and second output terminals, respectively, the improvement comprising:

first and second charge storage means respectively coupled to the first and second load transistors, for storing a charge proportional to the first and second output voltages during a first time period, and biasing the load transistors to establish and maintain a predetermined common-mode output voltage of the gain stage during a second time period; and switching means for placing the gain stage in unity gain during the first time period and simultaneously coupling the first and second charge storage means to the first and second output terminals while coupling the load transistors in a diode configuration.

5. The gain stage of claim 4 wherein the first and second charge storage means comprise first and second capacitors, each capacitor respectively coupled between a control electrode and a current electrode of a predetermined one of the load transistors.

6. A method for establishing during a first time period and maintaining during a second time period a predetermined common-mode output voltage in a fully differential gain stage having a pair of differential input transistors for receiving first and second input voltages, a pair of load transistors coupled to the differential input transistors for providing a load to the input transistors, and a current supply connected to the differential input transistors for providing drive current, comprising the steps of:

configuring each of the load transistors as a diode during the first time period;

connecting the gain stage in unity gain during the first time period;

charging charge storage means to a predetermined proportion of the common-mode output voltage during the first time period;

reconfiguring the load transistors as transistors and disconnecting the gain stage from unity gain immediately prior to the second time period; and biasing the load transistors with the charge storage means during the second time period to maintain the predetermined common-mode output voltage.

7. The method of claim 6 wherein the steps of the first and second time periods are consecutively repeated continuously.

8. A fully differential gain stage for receiving first and second input voltages and providing first and second output voltages proportional to a differential of the first and second input voltages, comprising:

a first transistor of a first conductivity type having a first current electrode connected to a first output terminal, a second current electrode, and a control electrode for receiving the first input voltage;

a second transistor of the first conductivity type having a first current electrode connected to a second output terminal, a second current electrode, and a control electrode for receiving the second input voltage;

a third transistor of the first and conductivity type having a first current electrode connected to the second current electrode of both the first and second transistors, a second current electrode connected to a first terminal for receiving a first power supply voltage, and a control electrode for receiving a bias voltage;

a fourth transistor of a second conductivity type having a first current electrode connected to the first output terminal, a second current electrode connected to a second terminal for receiving a second power supply voltage, and a control electrode;

a fifth transistor of the second conductivity type having a first current electrode connected to the second output terminal, a second current electrode connected to the second terminal for receiving the second power supply voltage, and a control electrode;

first switching means having a first electrode connected to the first output terminal, and a second electrode connected to the first input terminal;

second switching means having a first electrode connected to the first output terminal, and a second electrode connected to the control electrode of the fourth transistor;

a first capacitor having a first electrode connected to both the control electrode of the fourth transistor and the second electrode of the second switching means, and a second electrode connected to the second terminal for receiving the second power supply voltage;

third switching means having a first electrode connected to the second output terminal, and a second electrode connected to the second input terminal;

fourth switching means having a first electrode connected to the second output terminal, and a second electrode connected to the control electrode of the fifth transistor; and a second capacitor having a first electrode connected to both the control electrode of the fifth transistor and the second electrode of the fourth switching means, and a second electrode connected to the second terminal for receiving the second power supply voltage.

* * * * *

UNITED STATES PATENT AND TRADEMARK OFFICE
CERTIFICATE OF CORRECTION

PATENT NO. : 4,577,162

DATED : March 18, 1986

INVENTOR(S) : Joe W. Peterson

It is certified that error appears in the above-identified patent and that said Letters Patent is hereby corrected as shown below:

In claim 8, column 7, line 1, delete "and".

Signed and Sealed this

Seventeenth Day of June 1986

[SEAL]

Attest:

DONALD J. QUIGG

*Attesting Officer*  *Commissioner of Patents and Trademarks*